United States Patent [19]
Tobben

[11] Patent Number: 6,066,569
[45] Date of Patent: *May 23, 2000

[54] DUAL DAMASCENE PROCESS FOR METAL LAYERS AND ORGANIC INTERMETAL LAYERS

[75] Inventor: Dirk Tobben, Fishkill, N.Y.

[73] Assignee: Siemens Aktiengesellschaft, Munich, Germany

[*] Notice: This patent issued on a continued prosecution application filed under 37 CFR 1.53(d), and is subject to the twenty year patent term provisions of 35 U.S.C. 154(a)(2).

[21] Appl. No.: 08/940,895

[22] Filed: Sep. 30, 1997

[51] Int. Cl.[7] .................... H01L 21/302; H01L 21/461
[52] U.S. Cl. .................. 438/717; 438/723; 438/724; 438/733
[58] Field of Search .................... 438/719, 735, 438/733, 743, 744, 700, 713, 701, 717, 723, 724, 706

[56] References Cited

U.S. PATENT DOCUMENTS

| | | | |
|---|---|---|---|
| 4,472,240 | 9/1984 | Kameyama | 156/648 |
| 4,529,860 | 7/1985 | Robb | 219/121 |
| 4,950,618 | 8/1990 | Sundaresan | 437/40 |
| 5,256,583 | 10/1993 | Hollinger | 437/41 |
| 5,259,924 | 11/1993 | Mathews | 156/653 |
| 5,378,309 | 1/1995 | Rabinzohn | 156/643 |
| 5,492,736 | 2/1996 | Laxman | 427/579 |
| 5,614,765 | 3/1997 | Avanzino et al. | 257/774 |
| 5,635,423 | 6/1997 | Huang et al. | 437/195 |
| 5,652,182 | 7/1997 | Cleeves | 437/195 |

*Primary Examiner*—Benjamin L. Utech
*Assistant Examiner*—Kin-Chan Chen
*Attorney, Agent, or Firm*—Stanton C. Braden

[57] ABSTRACT

A process for the manufacture of silicon integrated circuits uses a dual damascene metallization process with an organic intermetal dielectric (14). A pattern to be etched is first etched in a hard mask (16) without exposing the underlying intermetal dielectric (14) and then transferred into the intermetal dielectric (14) on an enlarged scale.y

20 Claims, 2 Drawing Sheets

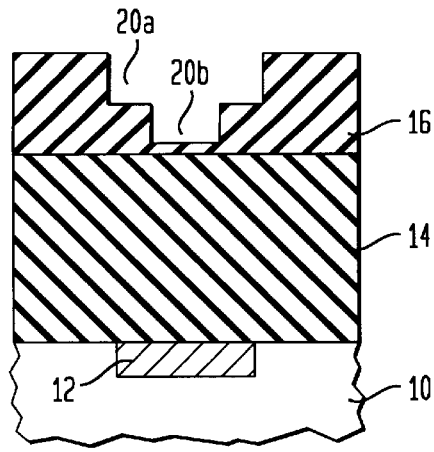
FIG. 4
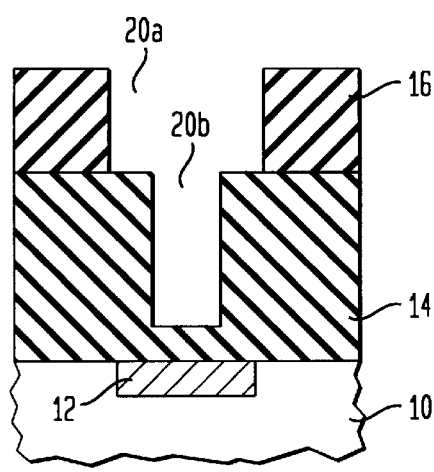
FIG. 5
FIG. 6
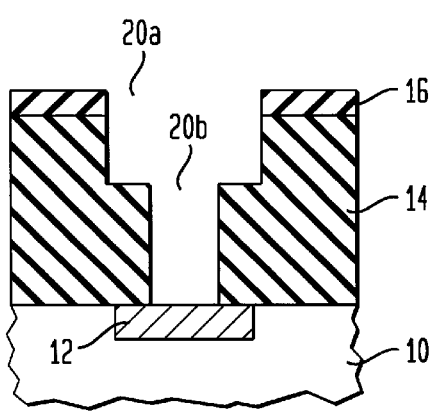
FIG. 7
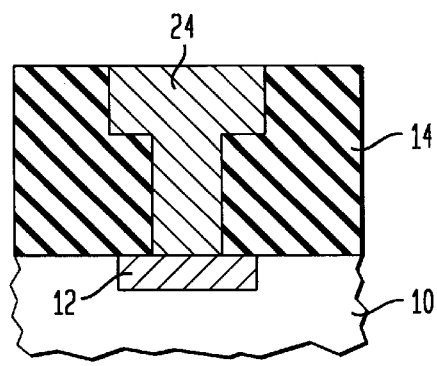

DUAL DAMASCENE PROCESS FOR METAL LAYERS AND ORGANIC INTERMETAL LAYERS

FIELD OF THE INVENTION

This invention relates to a manufacture of integrated circuit devices, and more particularly, to a process for providing the interconnection of the circuit components into an integrated circuit.

BACKGROUND OF THE INVENTION

In the manufacture of integrated circuits, after the incorporation in the silicon chip of the various different conductivity regions that form its circuit components, there arises the need to interconnect these components. Generally this is done by forming over the surface of the silicon chip layers that include patterned metal layers and intermetal dielectric layers. Typically such layers also need to include vias and grooves by way of which the metal layers make connections to one another or to selected portions of the surface of the silicon chip.

As integrated circuits get more dense, it becomes particularly important to keep stray capacitance between the metal layers small. This favors the use of intermetal dielectric layers that have a low dielectric constant, such as layers of organic compositions. Various organic materials, that are free of silicon such as amorphous fluorocarbons, parylenes, and polyarylethers, are considered prime candidates for this role. Since these materials, unlike silicon oxide and silicon nitride, which have typically been used for intermetal dielectric layers, do not include silicon, they generally are etchable in oxygen plasmas. This poses problems since the use of oxygen plasmas is the method of choice for stripping the residual photoresist and anti-reflection coatings (ARC) that are in wide use in the photolithography used for patterning the various layers involved. Hence for the continued use of oxygen plasmas in such roles, it is often important to use hard masks to pattern vias and grooves in such organic intermetal dielectrics, where a "hard mask" is one that is little eroded when serving its masking function.

The present invention has particular application to dual damascene processes for providing the intermetal dielectric layers. Dual damascene processing is described in detail in an article entitled "Making the Move to Dual Damascene Processing" that appeared on pages 79–82 of Semiconductor International, August 1997, which publication is incorporated herein by reference. As is described in this paper, damascene processing involves the creation of interconnect lines by first etching a trench in a planar dielectric layer and then overfilling the trench with a first metal, such as aluminum or copper. After this filling, the metal and dielectric layers are planarized, typically by chemical mechanical polishing (CMP). Dual damascene processing involves a second metallic level in which a series of holes (vias) are etched in a dielectric layer and filled in addition to the trench. Such metal levels generally are separated by a dielectric layer, described as the intermetal dielectric (IMD). The need for two levels of metal requires the need for at least two steps in the intermetal dielectric. Typically this has been done by multiple patterning and etching of the IMD.

The main advantage of the damascene process is the elimination of the need to etch the metal layer that provides the interconnections. Another advantage is that it can eliminate the need for a dielectric gap fill. A third advantage is that it avoids some of the problems associated with lithographic overlay tolerance, making it possible to achieve higher interconnect packing density.

SUMMARY OF THE INVENTION

The present invention is directed to a dual damascene process that uses an organic intermetal dielectric (IMD) and a hard mask that is patterned to include at least a pair of steps, and then involves transfer of the multistep pattern into the IMD. Moreover, the multistep pattern that is used to control the etching of the IMD is first formed completely in a hard mask, while the IMD is shielded. Additionally in the processing, cleaning of anti-reflecting coatings (ARC) and stripping of photoresists (PR) are completed prior to the main etch of the IMD so that the IMD is never subjected to any oxygen plasma that might erode it, other than the main etch.

The present invention is directed to a process for manufacturing integrated circuits, particularly those that use organic intermetal dielectrics, that proceeds as follows: first there is deposited over a semiconductive workpiece a layer of the intermetal dielectric that needs to be patterned; then this layer is covered with a relatively thick layer of a material suitable for use as a hard mask; next without exposing the intermetal dielectric layer, there is etched in the hard mask the multistep pattern that is to be etched in the intermetal dielectric layer; next the workpiece is etched in a blanket etch that essentially completes the patterning of the multistep pattern in the intermetal dielectric; then the pattern is overfilled with metal; and finally the metal is polished back to planarize the surface. Typically the hard mask will be a layer of silicon oxide or a dual layer of silicon nitride overlying a layer of silicon oxide. In the latter case the underlying silicon oxide serves as an etch stop to limit the etching of the first step of the desired pattern to the silicon nitride to insure that the intermetal dielectric remains unexposed. Also advantageously the final etch is such that the intermetal dielectric layer is etched faster than the hard mask layer so that the features of the pattern formed initially in the hard mask are exaggerated when formed in the intermetal dielectric.

Generally the workpiece is a large wafer that ultimately will be diced up into a number of individual chips within which there will be included one or more integrated circuits.

Viewed from one specific aspect, the present invention is directed to a process for the manufacture of an semiconductive integrated circuit comprising the steps of: preparing a semiconductive workpiece to which a conductive connection is to be provided; providing a layer of an intermetal dielectric over the top surface of the workpiece; depositing a layer of a hard mask material over the intermetal dielectric layer; patterning to less than its full thickness the hard mask layer to form therein a stepped pattern without exposing the underlying intermetal dielectric layer; etching the workpiece to transfer the stepped pattern into the intermetal dielectric; and filling the pattern with a desired metal.

The invention will be better understood from the following more detailed description taken in conjunction with the accompanying drawings.

BRIEF DESCRIPTION OF THE DRAWING

FIGS. 1–7 show cross sections of the silicon workpiece at successive stages of the process in accordance with an illustrative embodiment of the invention.

It should be noted that the drawings are not necessarily to scale.

DETAILED DESCRIPTION

Figure 1:
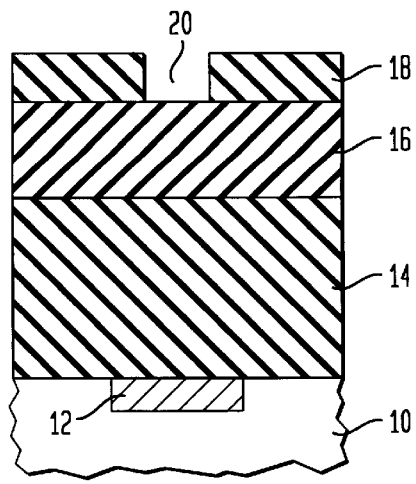

FIG. 1 shows as a workpiece a portion of a planar substrate 10 that includes a surface region 12 to which a connection needs to be provided. The substrate 10 may be a portion of a silicon chip and region 12 an area of particular conductivity to which a conductive connection must be made. Alternatively, substrate 10 may include an overlying planar dielectric layer in which there has previously been formed a conductive region 12 to which a connection needs to be made. Overlying the substrate 10 is a layer 14 of an organic intermetal dielectric (IMD). Typically this layer 14 has a thickness of about 5,000–15,000 Angstroms.

The layer 14 may be of an organic material free of silicon of the kind previously mentioned that either can be deposited out of the gas phase, such as amorphous fluorocarbons or parylenes, or can be spun on, such as fluoropolyarlethers or polyimides. Overlying the layer 14 is a layer 16 of a hard mask material, that will not be readily etched by an oxygen plasma. This layer 16 may comprise, for example, either a single layer of silicon oxide, or a dual layer of silicon oxide covered by a layer of silicon nitride. This mask layer 16 in turn is covered by a layer 18 of photoresist that has been patterned to provide opening 20.

Figure 2:
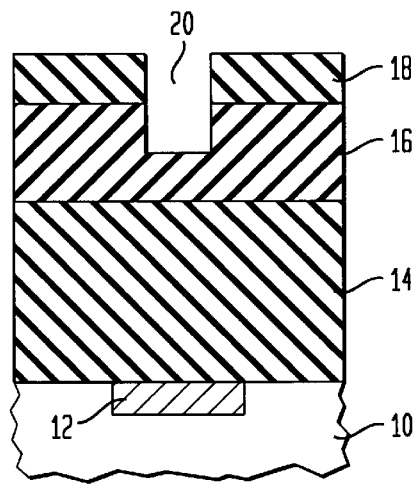

Next, as is shown in FIG. 2, the workpiece is subjected to a etch to extend the opening 20 only partly through the mask layer 16 and so less than its full thickness to define the first step of the two step pattern to be formed in the hard mask. If the mask layer is a single layer, a timed etch is used to control the depth into mask layer 14. If the mask layer 16 is a dual layer of silicon oxide and silicon nitride, the hole is made to penetrate to the surface of the underlying silicon oxide. This is best done by use of a reactive ion etch that etches silicon nitride preferentially with respect to silicon oxide, so that the silicon oxide acts as an etch stop. There are known fluorine-based etchants that will have this characteristic.

This procedure serves to move the etch pattern in this original PR only partially through the mask layer 16.

Figure 3:
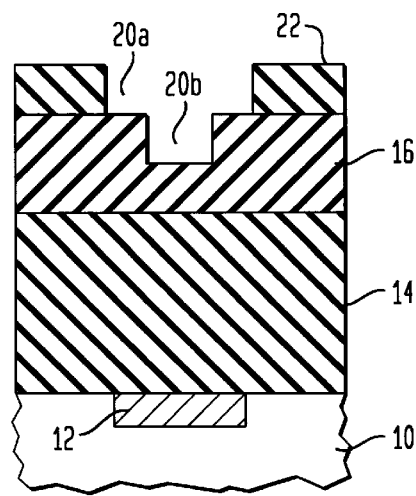

Next, as is shown in FIG. 3, the original photoresist 18 is stripped off and a new PR 22 is deposited over the mask layer 16 and patterned to provide for the second step in the mask layer a pattern different than the one that has already been put into the mask layer 16, as is seen in FIG. 3.

After this, the workpiece is etched again, to modify the earlier pattern to form a two-step pattern in the hard mask 16, as is shown in FIG. 4. Now the hole 20 in the mask layer 16 has a top portion 20*a* widened to correspond to the pattern in mask 22 and a lower portion 20*b* whose width remains that corresponding to the earlier pattern in mask 20 and whose depth does not yet extend to the IMD layer 14. Typically the width of opening 20*a* is about 0.25 micron and that of opening 20*b* is 0.175 micron. In this fashion there is put into the hard mask layer 16 a two step pattern with an opening that has two widths, an upper wider one that corresponds to the width of the metal that will interconnect various regions 12 of the silicon chip and an lower narrower width that will be useful to provide localized connections between the layer 12 and another higher layer of metal. Moreover, this stepped pattern has been formed in the hard mask 16 in a way that both lithography and the resist stripping steps are performed while the organic IMD layer 14 is completely protected from the oxygen plasma that normally will be used to do both the lithography and resist stripping for forming the stepped pattern in the hard mask.

Moreover, advantageously the second etch of the hard mask layer 16 also serves as an ARC etch. It not only opens up the area above the earlier pattern but also removes the ARC from the trench created during the first etch of the hard mask.

Of course, the original thickness of the mask layer should be sufficient that little erosion of the hard mask occurs except in the patterned regions.

Then after the photoresist and the ARC coatings have been stripped there is completed the blanket etching of the hard mask to reach down to the layer of the IMD layer 14, and reducing somewhat the thickness of the mask layer. There should be little affected the vertical height of the via opening 20*b*, up to now.

Now there remains to transfer the multistep etch pattern in the hard mask to the IMD, in a manner to increase the height of the narrow portion 20*b* more than that of the wider portion 20*a*.

Again one proceeds with a blanket anisotropic etch that etches the IMD 14 faster than the remaining hard mask 16 so that the wider via opening 20*a* extends the full height of the mask layer to expose the top of the IMD layer 16, as seen in FIG. 5. The height of the narrow opening 20*b* has now been increased disproportionately because of the faster rate at which the IMD is etched as compared to the mask. To further achieve this faster rate it is generally desirable to increase the oxygen content of the etchant. The height at this stage of the hole 20*b* advantageously is greater than that targeted for the final structure in order to permit some overetch.

Next there is a final etch through the IMD layer 14 to extend opening 20*b* to the surface region 12 of substrate 10. Advantageously region 20*b* opening should reach the surface region 12 before the 20*a* groove reaches its desired depth so that an overetch occurs in via 20*b*. This serves also to improve the cleaning of opening 20*b*. This etch step advantageously is done with an isotropic RIE using an oxygen plasma. FIG. 6 shows the result of this final etch. Advantageously one may leave a thin portion of the hard mask 16, as shown in FIG. 6, to serve as a stopping layer for the chemical mechanical planarization after the opening has been overfilled with a metal and polished back. Alternatively, if total stripping is required a suitable etch chemistry can be used for the final etch.

Finally, the metal layer 24 that is to provide the conductive interconnect, for example of copper or aluminum, is deposited over the workpiece and subjected to chemical mechanical planarization in the usual fashion to leave the workpiece as shown in FIG. 7.

It should be understood that the particular process described is merely illustrative of the general principles of the invention. For example, a wide choice of the mask materials, the IMD, and the etchants and the geometries involved is available without departing from the spirit and scope of the invention. Still further, the invention can find use with semiconductive workpieces of other than silicon.

What is claimed is:

1. A process for the manufacture of a semiconductive integrated circuit comprising the steps of:
   preparing a semiconductive workpiece that includes at least one circuit element to which a conductive connection is to be provided;
   providing a layer of an organic intermetal dielectric free of silicon over the top surface of the workpiece;
   depositing a layer of a hard mask material over the intermetal dielectric layer;
   patterning the hard mask layer to less than its full thickness to form therein a stepped pattern without exposing the underlying intermetal dielectric layer;
   etching the workpiece to transfer the stepped pattern into the intermetal dielectric; and filling the stepped pattern with a an interconnection metal to provide a connection to the at least one circuit element.

2. The process of claim 1 in which the stepped patterning of the hard mask includes separate patterning of first and second levels in the hard mask.

3. The process of claim 2 in which the intermetal dielectric is a silicon-free organic material.

4. The process of claim 3 in which the semiconductor is silicon.

5. The process of claim 4 in which the hard mask layer is of silicon oxide.

6. The process of claim 4 in which the hard mask layer comprises a layer of silicon nitride overlying a layer of silicon oxide.

7. The process of claim 2 in which the stepped pattern includes a deeper portion of a first width and a an upper portion of a second width which is greater than the first width.

8. The process of claim 7 in which the etching of the workpiece to transfer the stepped pattern in the hard mask on an enlarged scale into the intermetal dielectric uses an etch that etches preferentially the intermetal dielectric layer over the hard mask.

9. The process of claim 8 in which the semiconductor is silicon.

10. The process of claim 9 in which the intermetal dielectric layer is a silicon-free organic material.

11. The process of claim 10 in which the hard mask comprises a layer of silicon oxide.

12. The process of claim 11 in which the hard mask comprises a layer of silicon nitride overlying a layer of silicon oxide.

13. The process of claim 12 in which the hard mask is patterned by an anisotropic fluorine-based etch.

14. The process of claim 9 in which the transfer of the stepped pattern in the hard mask to the stepped pattern in the intermetal dielectric uses an anisotropic oxygen plasma etch.

15. The process of claim 1 in which the intermetal dielectric layer is an organic compound.

16. A dual damascene process for providing an interconnection conductor over the surface of a silicon substrate in which there have previously been formed a plurality of circuit components that need to be interconnected to form an integrated circuit comprising the steps of:

forming over the top surface of a silicon substrate that includes a plurality of circuit components that are to be interconnected into an integrated circuit a first layer suitable for use as an intermetal dielectric free of silicon;

forming over the first layer a second layer suitable for use as a hard mask;

forming over the second layer a third layer of a photoresist having a narrow opening;

patterning the narrow opening of the photoresist into the hard mask to a first shallow depth;

replacing the third layer of photoresist with a new fourth layer of photoresist having an opening wider than the narrow opening and overlying the narrow opening formed in the hard mask;

patterning the wider opening of the fourth layer of photoresist into the hard mask for forming in the hard mask a deeper pattern of the narrow opening and a shallower pattern of the wider opening for forming a stepped pattern in the hard mask to less than the full thickness of the hard mask;

transferring the stepped pattern in the hard mask into the intermetal dielectric layer;

depositing a conductive layer over the top of the silicon substrate for filling the stepped pattern in the hard mask and forming the interconnection to a circuit component in the silicon substrate.

17. The process of claim 16 in which the second layer suitable for use as the hard mask includes an underlying layer of silicon oxide and an overlying layer of silicon nitride, and the first narrow opening is made initially essentially only in the overlying silicon nitride layer and is moved into the underlying silicon oxide layer when the opening wider the narrow opening is formed in the silicon nitride layer.

18. The process of claim 17 in which the stepped pattern is enlarged when formed in the intermetal dielectric by using an etchant that etches the intermetal dielectric faster than the hard mask.

19. The process of claim 18 in which the conductive layer is deposited over the top of the silicon substrate to overfill the pattern in the dielectric layer and the excess is removed by chemical mechanical polishing to planarize the conductive layer top surface.

20. The process of claim 18 in which the etching to transfer the stepped pattern in the hard mask to a pattern in the intermetal dielectric layer leaves a portion of the hard mask unetched to serve as a stopping layer for the subsequent planarizing of the top surface of the workpiece.

* * * * *